(12) United States Patent
Heydari et al.

(10) Patent No.: US 7,187,550 B1
(45) Date of Patent: Mar. 6, 2007

(54) GASKETED FIELD-REPLACEABLE ACTIVE INTEGRATED LIQUID PUMP HEAT SINK MODULE FOR THERMAL MANAGEMENT OF ELECTRONIC COMPONENTS

(75) Inventors: Ali Heydari, Albany, CA (US); Vadim Gektin, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 11/225,986

(22) Filed: Sep. 14, 2005

(51) Int. Cl.
*H05K 7/20* (2006.01)

(52) U.S. Cl. ............... 361/699; 165/80.4; 165/104.33; 174/15.1; 257/714

(58) Field of Classification Search ........ 361/698–699, 361/710, 717–718; 165/80.4, 104.33; 174/15.1; 137/613; 257/714
See application file for complete search history.

(56) References Cited

U.S. PATENT DOCUMENTS

| | | | | |
|---|---|---|---|---|
| 5,436,501 A | * | 7/1995 | Ikeda | 257/714 |
| 5,731,954 A | * | 3/1998 | Cheon | 361/699 |
| 5,901,037 A | * | 5/1999 | Hamilton et al. | 361/699 |
| 6,191,599 B1 | * | 2/2001 | Stevens | 324/760 |
| 6,263,957 B1 | * | 7/2001 | Chen et al. | 165/80.4 |
| 6,377,453 B1 | * | 4/2002 | Belady | 361/687 |
| 6,600,649 B1 | * | 7/2003 | Tsai et al. | 361/697 |
| 6,637,231 B1 | | 10/2003 | Monfarad | |
| 6,648,064 B1 | * | 11/2003 | Hanson | 165/120 |
| 6,650,542 B1 | * | 11/2003 | Chrysler et al. | 361/699 |
| 6,687,122 B2 | | 2/2004 | Monfarad | |
| 6,741,469 B1 | | 5/2004 | Monfarad | |
| 6,809,928 B2 | * | 10/2004 | Gwin et al. | 361/699 |
| 6,945,315 B1 | * | 9/2005 | Gektin et al. | 165/80.4 |
| 7,013,959 B2 | * | 3/2006 | Lee et al. | 165/104.33 |
| 7,032,392 B2 | * | 4/2006 | Koeneman et al. | 62/77 |
| 7,044,196 B2 | * | 5/2006 | Shook et al. | 165/80.3 |
| 7,120,021 B2 | * | 10/2006 | Hamman | 361/699 |

* cited by examiner

*Primary Examiner*—Michael Datskovsky
*Assistant Examiner*—Robert J. Hoffberg
(74) *Attorney, Agent, or Firm*—Peter J. Meza; William J. Kubida; Hogan & Hartson LLP

(57) ABSTRACT

A field-replaceable active pumped liquid heat sink module includes a liquid pump, a radiator, an optional receiver, and a gasketed cold heat exchanger box, all of which are connected together in a liquid pump loop through which a coolant such as water is circulated. The liquid pump, radiator, optional receiver and gasketed cold heat exchanger box are in a liquid pump loop and are self-contained in a field-replaceable active pumped liquid heat sink module. The heat sink module provides direct contact between the liquid coolant and the top portion of the targeted electronic component, which can be a CPU.

20 Claims, 3 Drawing Sheets

GASKETED FIELD-REPLACEABLE ACTIVE INTEGRATED LIQUID PUMP HEAT SINK MODULE FOR THERMAL MANAGEMENT OF ELECTRONIC COMPONENTS

RELATED CASE INFORMATION

The present application is related to my two patent application Ser. No. 11/196,905, entitled "UNITARY FIELD-REPLACEABLE ACTIVE INTEGRATED LIQUID PUMP HEAT SINK MODULE FOR THERMAL MANAGEMENT OF ELECTRONIC COMPONENTS" and Ser. No. 11/196,963, entitled "MULTIPLE COMPONENT FIELD-REPLACEABLE ACTIVE INTEGRATED LIQUID PUMP HEAT SINK MODULE FOR THERMAL MANAGEMENT OF ELECTRONIC COMPONENTS" which are both hereby incorporated in their entirety by this reference.

FIELD OF THE INVENTION

The present invention is related to heat sinks for removing heat from electronic components such as integrated circuit processors.

BACKGROUND OF THE INVENTION

Removal of heat has become one of the most important challenging issues facing computer system designers today. As the rate of power dissipation from electronics components such as high performance server processors continues to increase, standard conduction and forced-air convection fan air cooling techniques no longer provide adequate cooling for such sophisticated electronic components. The reliability of the electronic system suffers if high temperatures at hot spot locations are permitted to persist. Conventional thermal control schemes such as air cooling with fans, thermoelectric cooling, heat pipes, and passive vapor chambers have either reached their practical application limit or are soon to become impractical for high power electronic components such as computer server processors. When standard cooling methods are no longer adequate, computer manufacturers have to reduce the frequency of their processors to match the capacity of existing cooling apparatus. Furthermore, reliability can be compromised due to inadequate cooling using an existing cooling apparatus, or product release delayed until a reliable cooling apparatus for removal of heat from high heat dissipating processors can be made available.

The computer industry is seriously considering utilizing active liquid cooling as an alternative to conventional passive air cooling for high performance and high power processors. A number of attempts to incorporate liquid for cooling of high powered processors in the form of submerged liquid, liquid spray cooling, refrigeration cooling, and the like have been attempted in the past, but none of the existing active liquid cooling solutions has been utilized outside of specific design conditions. Additionally, these cooling solutions, while effective, can include a relatively high number of moving parts that can lead to increased product and maintenance costs.

What is desired, therefore, is a field-replaceable heat sink module that employs active liquid cooling, but has the same appearance as a traditional air-cooling heat sink, is sturdy, reliable, compact, simple to use, relatively inexpensive, and can be effectively employed in a wide range of applications.

SUMMARY OF THE INVENTION

According to an embodiment of the present invention, a field and/or customer replaceable integrated active pumped liquid heat sink module providing direct contact between the heat generating components and the coolant with built-in reliability features is suitable for thermal management of very high heat dissipation electronic components such as server processors. The field-replaceable integrated active pumped direct-contact liquid heat sink module is self-contained and is specifically designed to have physical dimensions similar to those of a standard air-based cooling system, such as a finned heat sink or heat pipe. As a result, the field-replaceable integrated active direct-contact liquid pumped heat sink module of the present invention can be utilized in existing electronic systems without the need for board or cabinet/rack modification or the "plumbing" associated with prior art liquid-based cooling systems. The gasket design of the heat sink module is such that a leak-free and reliable contact between the cooling fluid and the source of heat generation (bare die or the lid on top of the die) can be made.

According to an embodiment of the present invention, the field-replaceable active direct liquid contact pumped heat sink module includes a pump, a radiator cooling heat exchanger (heat sink fin), an optional liquid receiver, and embedded plumbing for cooling the liquid flow, all of which are connected together in a liquid pump cooling loop through which a coolant such as water is circulated. The liquid pump, radiator cooling heat exchanger, optional receiver and plumbing in an active direct-liquid contact liquid pump module are self-contained in a field-replaceable pumped liquid heat sink module.

From the view point of the end user, the entire liquid pump apparatus is sealed and contained in the heat sink module with two or more gaskets at the base of the heat sink. The target electronic component structure (such as the lid of a server processor) is placed into the liquid path of the direct-contact pumped liquid cooling loop for maximum cooling efficiency. Except for the electric wires needed to power the liquid pump, there is no difference in external appearance between a conventional heat sink and the heat sink module of the present invention. The function of the gaskets is to contain the cooling liquid inside the heat sink module while not assembled and to provide support and sealing to prevent liquid leakage when the electronic component is engaged with the gasketed direct liquid contact pumped integrated heat sink module. The coolant is pumped over a top portion of an electronic component (such as bare die or the lid of a server processor) extending into a into a cold heat exchanger box of the heat sink module, absorbing heat and therefore cooling the target electronic component to a desired temperature level. The pump action further causes the cooling fluid to flow into a radiant cooling heat exchanger of the heat sink module, where the heat is removed by air blown by a system fan. In the radiant cooling heat exchanger, the coolant is circulated such that it is cooled before being conveyed to an optional liquid receiver. From the optional receiver, the cooling fluid is returned to the pump for continuous recirculation. The liquid coolant is heated up in direct contact with the target electronic components, and in this process absorbs heat from heat generating source (such as a bare die or lid of a server processor) to produce the desired cooling effect.

In accordance with the present invention, the liquid pump used is one of several new generation pumps that are relatively small, on the order of two inches in diameter and three to four inches long.

The field-replaceable gasketed direct liquid contact pumped integrated heat sink module of the present invention is modular, self-contained, and can remove a great deal of heat by providing direct liquid contact to the heat generating sources of electronic components. The heat sink module of the present invention is field and/or customer replaceable with minimal effort using standard tools. In addition, unlike prior art liquid-based cooling system, the gasketed field-replaceable direct liquid contact pumped integrated heat sink module of the invention is capable of being attached directly to the components (such as server processors) that need cooling. In addition, the gasketed field-replaceable direct liquid contact pumped integrated heat sink module of the invention is compact and simple in both operation and installation, with minimal parts to fail or break and minimal added complexity. Therefore, the gasketed field-replaceable direct liquid contact pumped integrated heat sink module of the invention is sturdy and reliable.

The foregoing and other features, utilities and advantages of the invention will be apparent from the following more particular description of an embodiment of the invention as illustrated in the accompanying drawings.

DETAILED DESCRIPTION

Figure 1:
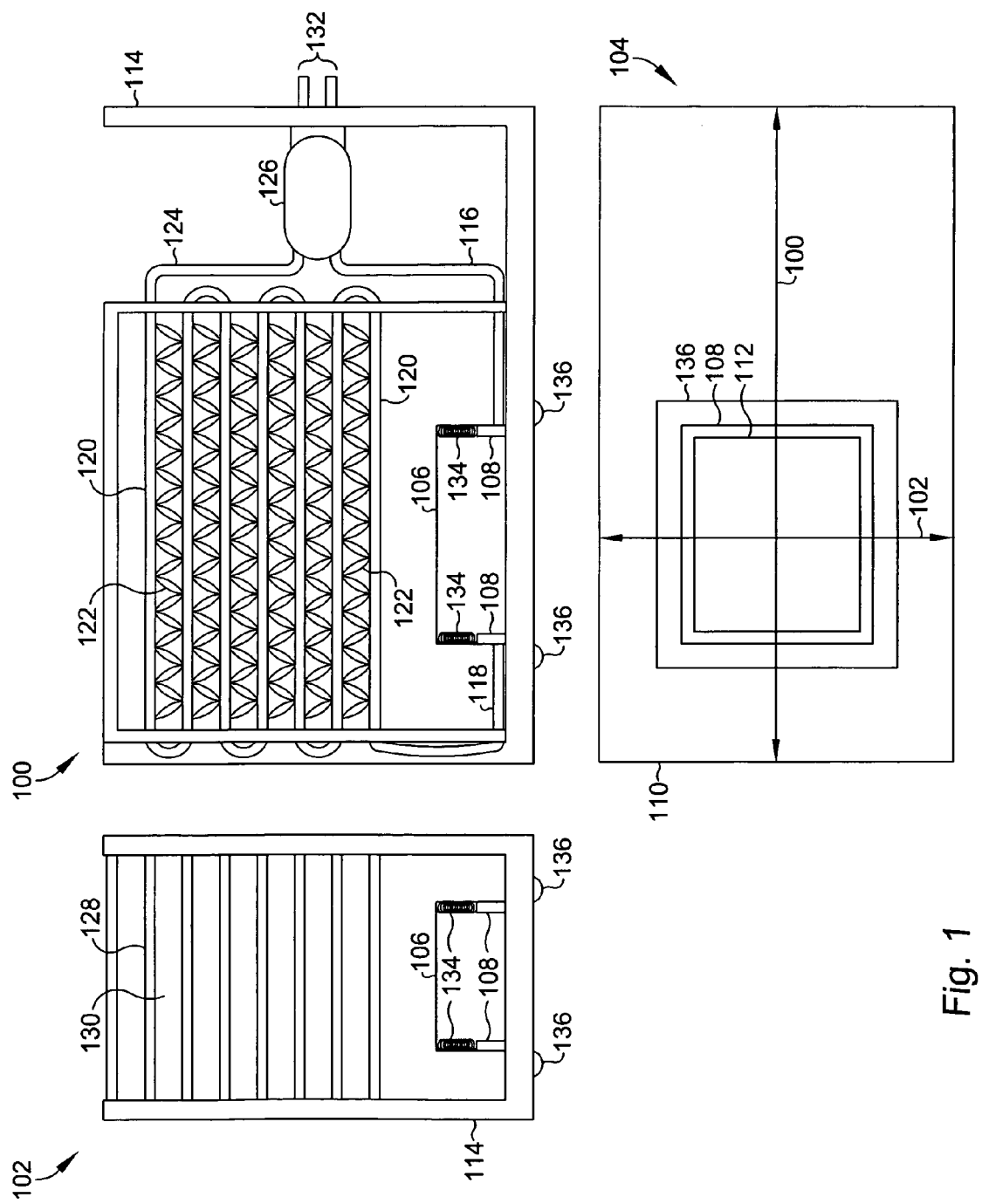
FIG. 1 shows two cross-sectional views and a bottom view of a gasketed field-replaceable active integrated liquid pump heat sink module according to an embodiment of the present invention.

Referring now to FIG. 1, a first cross-sectional view 100 of a gasketed field-replaceable active integrated liquid pump heat sink module according to an embodiment of the present invention includes a heat sink casing 114, which is typically fabricated out of aluminum, copper, or alloys thereof, or other similar metals or alloys, and is about 0.25 inches thick. The overall dimensions of the heat sink casing are typically about 5.0 inches by 3.0 inches by 1.75 inches, but can of course be changed as desired for a particular application. A cold heat exchanger box 106 is embedded into the heat sink casing 114. A spring-loaded inner gasket 108 is attached to a moveable heat sink pedestal that is flush with and forms part of the bottom surface of the heat sink casing 114. The actual moveable heat sink pedestal is not shown in FIG. 1 because it is obscured by the heat sink casing 114, but is identified and described in further detail below. A cross sectional view of the inner gasket 108 and attaching springs 134 are shown in FIG. 1. A fixed outer gasket 136 is affixed to the bottom surface of the heat sink casing 114 as shown. A hot liquid output line 118 is coupled to a radiator heat exchanger 120. The hot liquid output line 118 is fabricated out of copper or aluminum. The dimensions of the hot liquid output line 118 are about 1.5 inches long by about 0.125 inches, outside diameter, but these dimensions are tailored to the form factor of the overall heat sink casing. The wall thickness of the hot liquid output line 118 is between 1.0 and 2.0 mm. The dimensions of the hot liquid output line 118 are maintained for the other liquid lines throughout the radiator heat exchanger 120. The fluid lines in the radiator heat exchanger 120 are separated by a number of radiator fins 122, which are fabricated out of aluminum or copper. The radiator fins 122 can be any dimensions required for a required form factor, but are typically about 4.0 inches long and about 0.125 inches thick. A fluid such as water or a mixture of water and glycol or other such media flows through the lines in the radiator heat exchanger 120, and is gradually cooled without any phase change. The fluid is fully cooled at the uppermost line in the radiator heat exchanger 120 and emerges as the cold liquid return line 124 once fully cooled. In a typical application, the temperature of the fluid in the hot liquid output line 118 could be as high as 110° C., and, with proper air flow from an accompanying fan (not shown in FIG. 1) the temperature of the fluid in the cold liquid return line 124 can be as low as 25° C. The cold liquid return line 124 is coupled to the input port of a liquid pump 126. In accordance with an embodiment of the present invention, the liquid pump 126 is one of several new generation pumps that are relatively small, on the order of 1.5 inches in diameter and 3.0 to 4.0 inches long, although other dimension pumps can of course be used to fit a particular form factor. A suitable pump 126 for the unitary heat sink embodiment shown in FIG. 1 is a brushless miniature spherical pump. A miniature diaphragm pump or a positive displacement pump could also be used. The output port of liquid pump 126 is coupled to the cold liquid input line 116, which in turn is coupled to the input port of the cold heat exchanger 106 to complete the closed liquid flow path. Electrical connections 132 are provided to activate the liquid pump 126, which are the only outside connections required by the unitary heat sink module according to the present invention. The liquid pump 126 typically consumes about 10.0 watts of power, and is energized by a 12.0 volt connection and a ground connection. In the multi-component embodiment each liquid pump consumes about 10.0 watts of power.

A second cross-sectional view 102 of the gasketed field-replaceable active integrated liquid pump heat sink module according to an embodiment of the present invention is also shown in FIG. 1, which is orthogonal to cross-sectional view 100. Cross-sectional view 102 allows further detail of the heat sink module to be shown. The cross-sectional view of the heat sink casing 114 shows embedded cold heat exchanger box 106 as well as the moveable inner gasket 108 and attached springs 134 for allowing the gasket to traverse upwards inside the heat exchanger box 106. The fixed outer gasket 136 attached to the bottom of the heat sink casing 114 can also be seen in cross-sectional view 102. In cross-sectional view 102, the individual radiator heat exchanger liquid flow channels 128 are visible, as well as a side view of one course of the radiator heat exchanger fin plates 130.

A bottom view 104 of the gasketed field-replaceable active integrated liquid pump heat sink module according to an embodiment of the present invention is also shown in FIG. 1. The bottom view 104 shows the "footprint" of the heat sink base plate 110, as well as the footprint of the moveable pedestal 112 of the cold heat exchanger base box 106. The pedestal 112 (not shown in FIG. 1) retracts upwards into the heat sink module to allow the lid or upper portion of the integrated circuit processor or other target circuit (also not shown in FIG. 1) to come directly into contact with the coolant liquid. The footprint of the inner moveable gasket 108 and outer fixed gasket 136 are also shown in the bottom view 104. Two cross-sectional lines 100 and 102 are shown in the bottom view 104, representing the relative cross-sectional cuts for first and second cross-sectional views 100 and 102.

Figure 2:
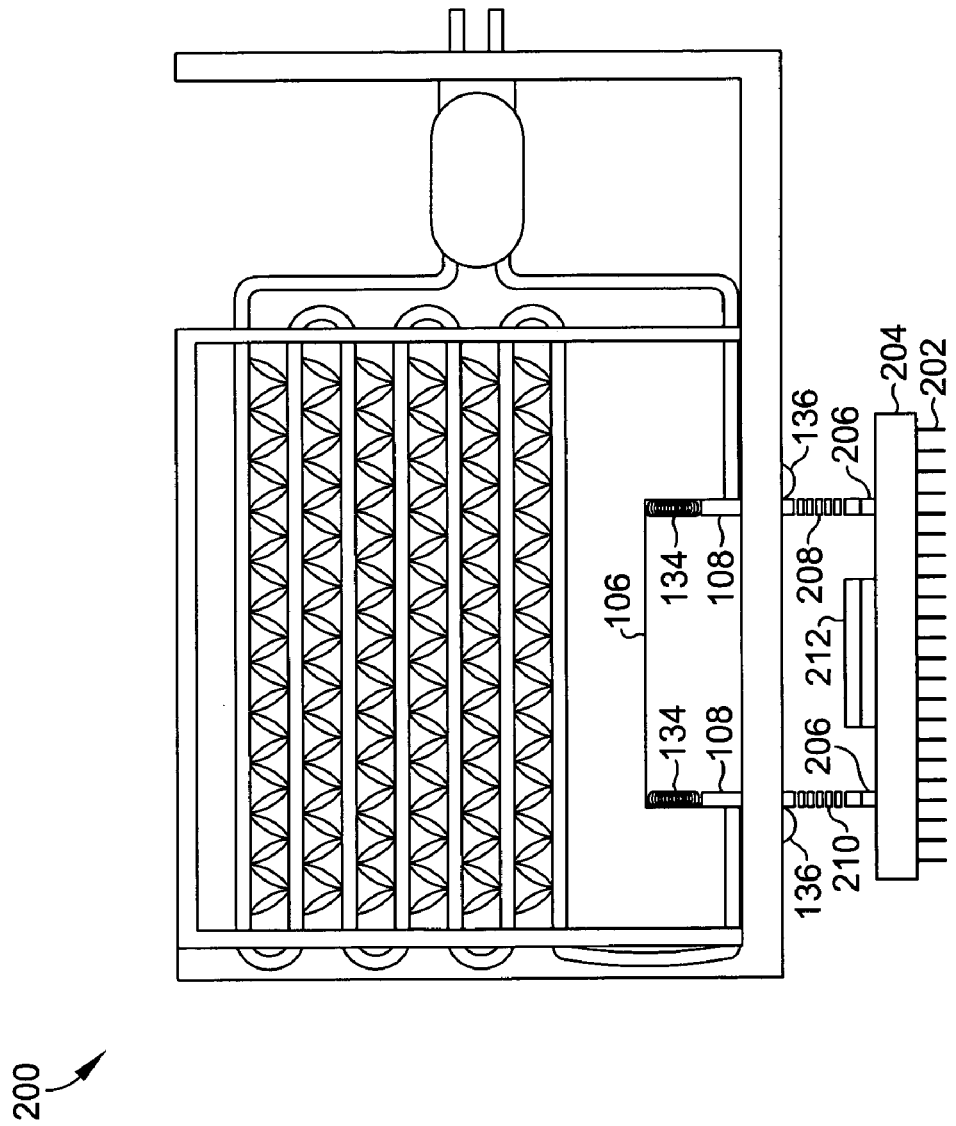
FIG. 2 shows a cross-sectional of the gasketed field-replaceable active integrated liquid pump heat sink module according to an embodiment of the present invention in an unassembled configuration, as well as the target CPU.
Figure 3:
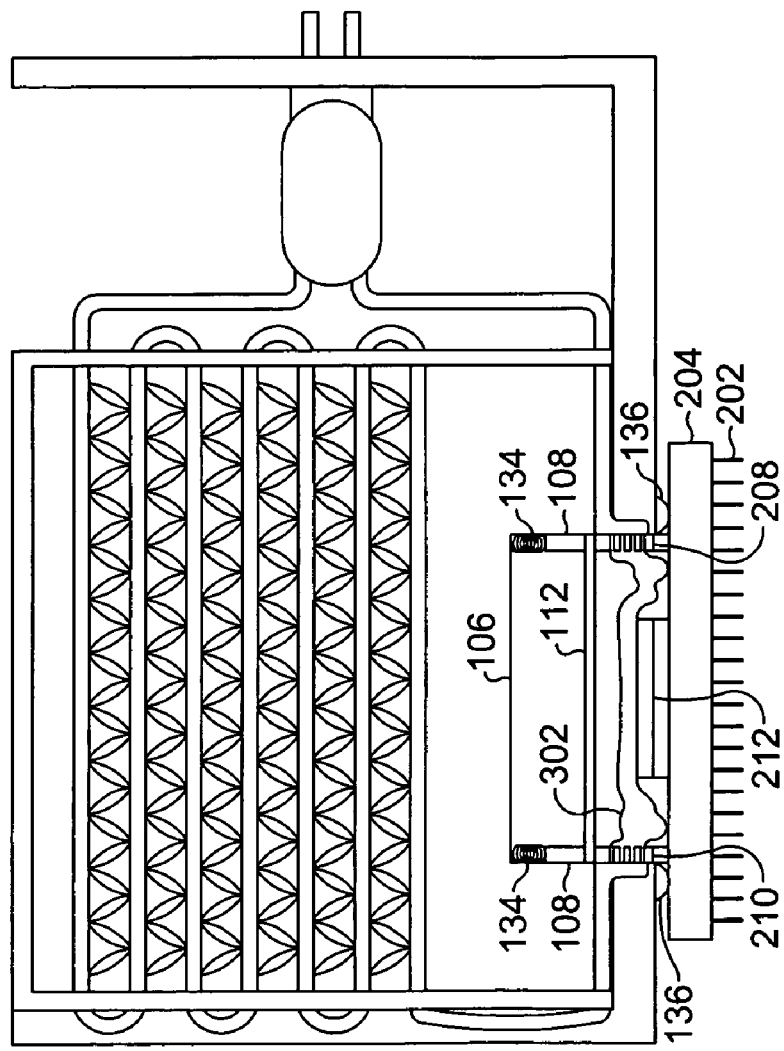
FIG. 3 shows the same cross-sectional view as in FIG. 2 of the gasketed field-replaceable active integrated liquid pump heat sink module according to an embodiment of the present invention in an assembled configuration, wherein a top portion of the target CPU is in direct contact with the sealed liquid coolant.

Referring now generally to FIG. 2, the gasketed heat sink module of the present invention is shown as a system 200 including a target circuit for cooling such as a CPU. Certain identification numerals are removed in FIG. 2, and other identification numerals associated with the CPU are included. In FIG. 2, the heat sink module system is shown in an unassembled state in which the CPU is positioned directly below the heat sink module in preparation for assembly and cooling according to the present invention. The actual CPU is shown as a "flip-chip" 212 with a solder bump attachment or the like to a substrate 204 having a number of interconnect pins 202. The CPU chip 212 is centrally positioned to push back the pedestal 112 of the cold heat exchanger box 106, which is shown in FIG. 3. The substrate also provides support for a CPU lid frame having an input 208 and an outlet 210. Input 208 and output 210 are perforated in a manner to allow the coolant liquid to flow, yet maintaining the structural integrity of the lid frame. The lid frame is glued to substrate 204 at points 206.

Referring now generally to FIG. 3, the gasketed heat sink module of the present invention is shown as a system 300 including a target circuit for cooling such as a CPU. Certain identification numerals are removed in FIG. 3, and other identification numerals associated with the CPU are included. In FIG. 3, the heat sink module system is shown in an assembled state in which CPU frame engages the moveable pedestal 112 such that the lid or upper portion of the CPU chip 212 is placed directly into the coolant liquid flow 302 according to the present invention. It is important to note in FIG. 3 that while the CPU chip 212 is placed in direct contact with the coolant liquid flow, all of the coolant liquid is still hermetically contained within the heat sink module. The inner gasket 108 is retracted into the cold heat exchanger box 106, and the springs 134 are compressed in the assembled state. Note that the outer stationary gasket 136 prevents any leakage of the coolant liquid at the bottom of the heat sink module, and the moveable pedestal 112 prevents any leakage at the top of the heat sink module. Thus, the coolant fluid is directed into a narrow channel, flowing directly over the CPU or other target circuit for removing heat with maximum efficiency. It is also important to note that the heat sink module shown in the assembled state of FIG. 3 returns to the unassembled state of FIG. 2 when the CPU assembly is removed. The moving pedestal 112 returns to the bottommost portion of the heat sink module, the inner gasket 108 and springs 134 return to their original position, and the coolant liquid ceases to flow as is shown in FIG. 2.

The heat sink module of the present invention may be used with a lidded or lidless CPU or other electronic component as discussed above. The choice of water as a coolant fluid is ideally only for the lidded case and not the lidless case. It will be apparent to those skilled in the art that many different coolant fluids can be used including, but not limited to water and water/glycol mix, as well as dielectric-type coolant fluids. Additionally, many different packaging types can be used in the lidded case. Finally, many different sealing and passivation techniques can be used in the lidless case to assure proper operation in conjunction with the coolant fluid chosen.

It will also be apparent to those skilled in the art that the CPU can be locked in to the heat sink module in a number of different ways. Possibilities include using a traditional attachment technique such as nuts and bolts, or engagement by pressing the CPU into the cold heat exchanger box, where the tip of the lid is engaged into a locking device built in to the heat sink cold heat exchanger box. Numerous other such locking or attachment mechanisms can be used.

While the invention has been particularly shown and described with reference to embodiments thereof, it will be understood by those skilled in the art that various other changes in the form and details may be made without departing from the spirit and scope of the invention. It should be understood that this description has been made by way of example, and that the invention is defined by the scope of the following claims.

We claim:

1. A field-replaceable unitary heat sink module employing active liquid cooling comprising:
    a heat sink casing;
    a radiator heat exchanger including a hot liquid output line and a cold liquid return line;
    a cold heat exchanger box having a movable inner gasket and heat sink pedestal, an input coupled to a cold liquid input line, and an output coupled to the hot liquid output line;
    a liquid pump having an input port coupled to the cold liquid return line and an output port coupled to the cold liquid input line, and electrical connections for receiving electrical pump power; and
    an outer sealing gasket coupled to a bottom portion of the heat sink casing.

2. The gasketed heat sink module of claim 1 wherein the entire liquid pump apparatus including the radiator heat exchanger, cold heat exchanger, and liquid pump is hermetically sealed and contained within the heat sink module.

3. The gasketed heat sink module of claim 1 wherein the heat sink casing is about 1.75 inches high.

4. The gasketed heat sink module of claim 1 wherein the cold heat exchanger box further comprises a set of springs attached to the moveable inner gasket.

5. The gasketed heat sink module of claim 1 wherein the heat sink pedestal can be placed at first and second positions within the cold heat exchanger box.

6. The gasketed heat sink module of claim 1 wherein a cooling fluid used in the radiator heat exchanger, cold heat exchanger, and pump comprises water.

7. The gasketed heat sink module of claim 1 wherein a cooling fluid used in the radiator heat exchanger, cold heat exchanger, and pump comprises a mixture of water and glycol.

8. The gasketed heat sink module of claim 1 wherein a cooling fluid flows through the radiator heat exchanger, cold heat exchanger, and pump in a closed system without any phase change.

9. The gasketed heat sink module of claim 1 wherein the liquid pump is about 1.5 inches in diameter.

10. The gasketed heat sink module of claim 1 wherein the liquid pump comprises a brushless miniature spherical pump, a miniature diaphragm pump or a positive displacement pump.

11. A field-replaceable gasketed heat sink module system employing active liquid cooling comprising:
    a heat sink casing;
    a radiator heat exchanger;
    a cold heat exchanger box having a retracted moveable inner gasket and displaced heat sink pedestal;

a liquid pump having electrical connections for receiving electrical pump power;

a CPU and CPU lid frame coupled to a substrate, the CPU lid frame having a fluid inlet and a fluid outlet for engaging the retracted moveable inner gasket and heat sink pedestal; and an outer sealing gasket coupled to a bottom portion of the heat sink casing, wherein the radiator heat exchanger, a bottom portion of the cold heat exchanger box below the displaced heat sink pedestal, and liquid pump are physically coupled together to form a closed active liquid cooling system.

12. The gasketed heat sink module system of claim 11 wherein the entire closed active liquid cooling system is hermetically sealed and contained within the heat sink module.

13. The gasketed heat sink module of claim 11 wherein the heat sink casing is about 1.75 inches high.

14. The gasketed heat sink module of claim 11 wherein the cold heat exchanger box further comprises a set of springs attached to the moveable inner gasket.

15. The gasketed heat sink module of claim 11 wherein the heat sink pedestal can be placed at first and second positions within the cold heat exchanger box.

16. The gasketed heat sink module system of claim 11 wherein a cooling fluid used in the radiator heat exchanger, cold heat exchanger, and pump comprises water.

17. The gasketed heat sink module system of claim 11 wherein a cooling fluid used in the radiator heat exchanger, cold heat exchanger, and pump comprises a mixture of water and glycol.

18. The gasketed heat sink module system of claim 11 wherein a cooling fluid flows through the radiator heat exchanger, cold heat exchanger, and pump in a closed system without any phase change.

19. The gasketed heat sink module system of claim 11 wherein the liquid pump is about 1.5 inches in diameter.

20. The gasketed heat sink module system of claim 11 wherein the liquid pump comprises a brushless miniature spherical pump, a miniature diaphragm pump or a positive displacement pump.

* * * * *